United States Patent [19]

Trihus

[11] 4,254,374
[45] Mar. 3, 1981

[54] CABLE TESTER

[76] Inventor: Axicor T. Trihus, 2719 Hamline Ave. North, St. Paul, Minn. 55113

[21] Appl. No.: 25,920

[22] Filed: Apr. 2, 1979

[51] Int. Cl.³ ............................................. G01R 31/14
[52] U.S. Cl. .......................................... 324/54; 324/51
[58] Field of Search ............ 324/54, 51, 73 R, 73 AT

[56] References Cited

U.S. PATENT DOCUMENTS

| 730,595 | 6/1903 | Badeau | 324/51 |
|---|---|---|---|
| 1,724,565 | 8/1929 | Dana | 175/183 |
| 1,974,275 | 9/1934 | Janovitch | 175/183 |
| 2,091,813 | 8/1937 | Hays | 324/54 |
| 2,130,865 | 9/1938 | Watts et al. | 175/183 |
| 2,439,940 | 4/1948 | Lewis | 175/183 |
| 2,603,686 | 7/1952 | Lloyd | 324/73 R |
| 3,141,128 | 7/1964 | Behr | 324/51 |
| 3,328,683 | 6/1967 | Davenport et al. | 324/51 |
| 3,354,386 | 11/1967 | Daigle et al. | 324/51 |
| 4,117,397 | 9/1978 | Fukao et al. | 324/54 |

*Primary Examiner*—David K. Moore
*Attorney, Agent, or Firm*—Kinney, Lange, Braddock, Westman and Fairbairn

[57] ABSTRACT

A portable cable tester is used to test electrical cables between transformers of an electrical power distribution system. The cable tester has a cylindrical housing with an elongated electrically conductive prod at one end for insertion into a receptacle connected to one conductor of the cable. The second end of the housing has an on/off switch, a second terminal, and an annunciator, which is preferably in the form of spark gap electrodes. The cable tester includes a capacitor (or capacitors) connected between the first and second terminals and charging circuitry for charging the capacitor. In use, the elongated prod is inserted into the receptacle connected to the one conductor, and the second terminal is connected to the other conductor of the cable. The on/off switch is turned on, and charging of the capacitor or capacitors is commenced. When the voltage across the capacitor attains a threshhold value, the annunciator is actuated. In the event that there is a fault in the cable such as a short between the inner and outer conductors, the voltage across the capacitor cannot attain the threshold value, and the annunciator is not actuated, thereby giving an indication of a faulty cable.

17 Claims, 6 Drawing Figures

4,254,374

CABLE TESTER

BACKGROUND OF THE INVENTION

1. Field of the Invention

The present invention is concerned with equipment used by repair personnel to locate the cause of a power failure in an electrical power distribution system. In particular, the present invention is a cable tester for testng sections of electrical cable.

2. Description of the Prior Art

In urban and suburban areas, there has been an increasing use of underground electrical cables for electrical power distribution. Considerations of general appearance, economics, congestion, and maintenance conditions have made underground construction desirable.

One difficulty with underground systems, however, is that it is generally more difficult to locate and repair a fault than in an overhead system. Since the cables are buried, visual inspection of the cables normally is not possible.

In the past, equipment has been provided for testing sections of electrical cable between transformers in order to determine whether that section of cable is the cause of the fault. In general, this equipment has been cumbersome and expensive. There is a continuing need for a compact, portable cable tester which is relatively simple to use and provides a clear indication of whether the cable being tested is defective.

SUMMARY OF THE INVENTION

The cable tester of the present invention tests an electrical cable to determine whether it is the cause of a power system fault. The cable tester of the present invention includes first and second terminals for connection to the first and second conductors of the cable being tested, which has been disconnected at both ends from the remainder of the power system. Capacitor means is connected between the first and second terminals and is charged by charging means. Annunciator means is actuated when the voltage across the capacitor means attains a threshhold value. Failure of the charging means to charge the capacitor means to the threshhold value is indicative of a fault in the cable.

The cable tester preferably is a compact, portable device having a cylindrical housing. The first terminal is in the shape of an elongated electrically conductive prod which extends from the first end of the housing, and the second terminal is located at the second end of the housing. The annuciator means and an on/off switch are also located at the second end. When the electrically conductive prod is inserted into a receptacle connected to the first conductor, and the second terminal is connected to the second conductor (which is normally the ground conductor), and the on/off switch is turned on, the charging means begins to charge the capacitor means. The threshhold value at which the annuciator means is actuated is selected so that a fault in the cable insulation will shunt the capacitor means and prevent the capacitor voltage from reaching the threshhold value. If, after a short period of time, the annuciator means has not been actuated, it can be concluded that the cable being tested is defective.

DETAILED DESCRIPTION OF PREFERRED EMBODIMENTS

Figure 4:
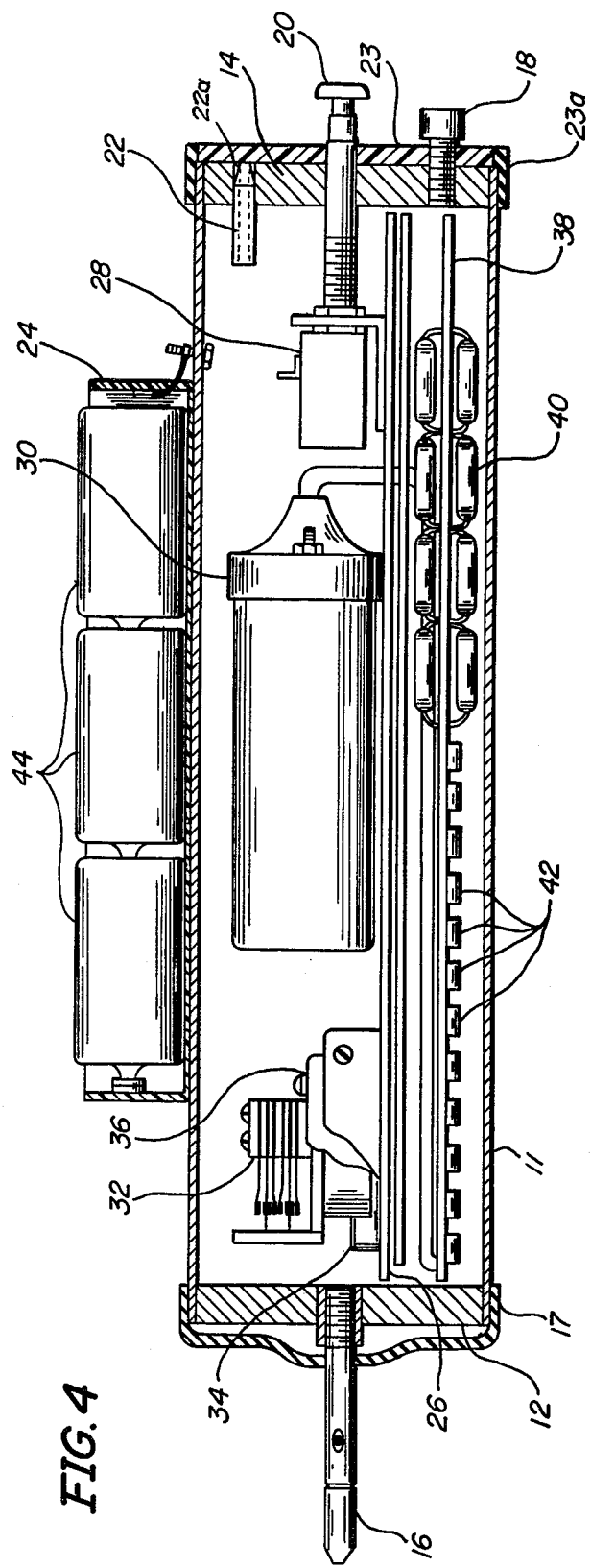
FIG. 4 is a side sectional view of the cable tester of FIG. 1.
Figure 1:
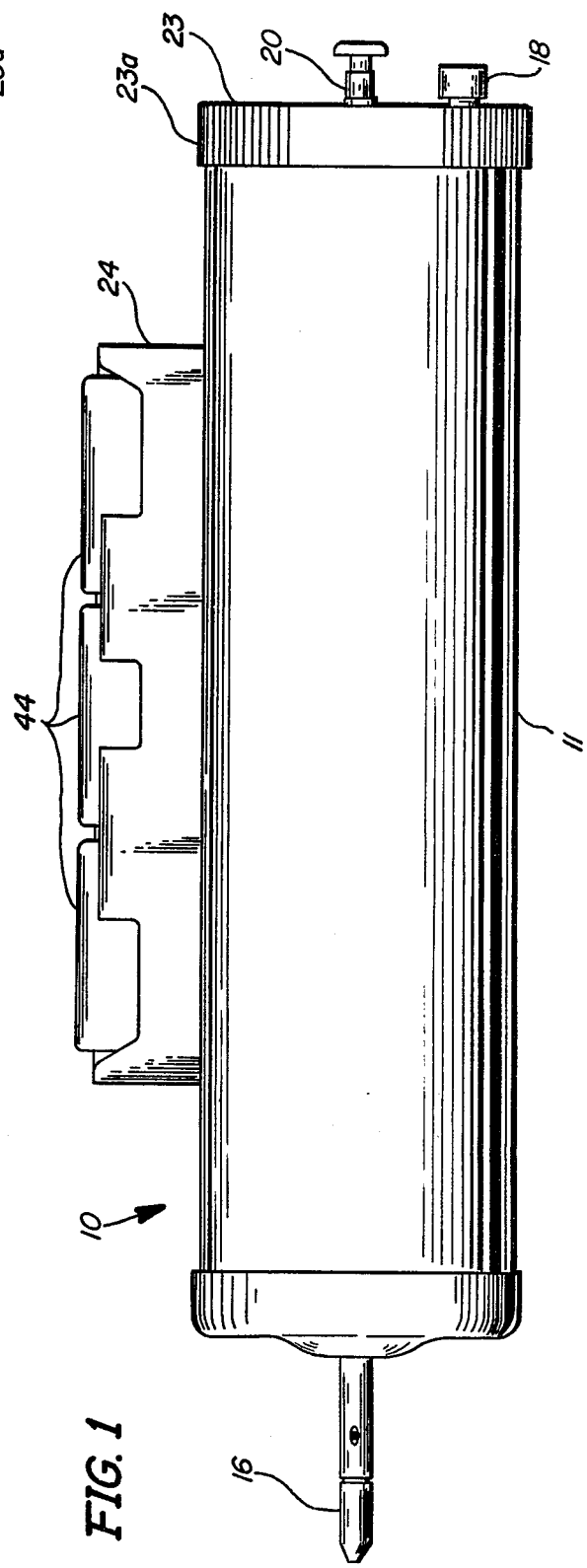
FIG. 1 is a side view of the cable tester of the present invention.

FIGS. 1-4 illustrate a preferred embodiment of cable tester 10 of the present invention. Cable tester 10 includes a cylindrical housing 11 with a front end plate 12 attached at one end and a rear end plate 14 attached at its other end. Projecting forward from front end 12 is elongated electrode or prod 16, which is electrically conductive and is adapted to be inserted into a receptacle connected to one conductor of an electrical cable. As shown in the Figures, prod 16 is preferably threaded for rapid connection to front end plate 12 and the circuitry of cable tester 10. Prod 16 may be removed when not in use, thereby permitting easier and more compact transportation of cable tester 10.

As shown in the Figures, front end plate 12 is an electrically conductive plate. In order to reduce the chance of an electrical discharge to adjacent grounded surfaces, an insulating cover 17 covers front end plate 12 and has an oening through which prod 16 extends. Cover 17 is preferably a flexible molded plastic or rubber. In another successful embodiment of the present invention, front end plate 12 is an insulator such as plastic, and cover 17 is not required.

Projecting through electrically conductive rear end plate 14 are ground terminal 18 and on/off switch handle 20. In addition, center electrode 22 and the surrounding portion of rear end plate 14 from spark gap annunciator 22a. In the preferred embodiments of the present invention, end plate 14 is covered by cover plate 23, which is a transparent electrically insulating material such as plastic through which the spark gap annuciator 22a may be viewed. Insulating ring 23a, which is preferably a rubber ring, also surrounds rear end plate 14 and cover plate 23. As will be described later, high voltage appears across spark gap annunciator 22a, and the presence of cover plate 23 over the spark gap annunciator 22a prevents the spark gap from becoming contaminated by rain or dust, and also prevents the person using the tester from accidentally receiving a shock from the spark gap annunciator 22a if protective gloves are not worn.

In still another successful embodiment cover plate 23 and plate 12 are one piece of plastic. An additional conductor is needed to connect the annunciator 22a to ground terminal 18. Air space is provided for escape of ionized gas generated in annunciator 22a.

Positioned at the top of cylinder 10 is battery box 24. Battery box 24 preferably contains batteries 44 sufficient to produce a six to twelve volt output. This output from battery box 24 is sufficient to provide the power for operation of the cable tester. In the embodiments shown in FIGS. 1-4, cable tester 10 is a totally self-powered unit which may be used at locations where no other electrical power is available or convenient. In other embodiments of the present invention, additional connections and circuitry are provided to permit tester 10 to operate with either battery power or AC line power.

FIG. 4 shows the location of the electrical components within cylinder housing 11. For the sake of clarity, the various wires connecting these components are not shown in FIG. 4. The connection of the components may be determined from the electrical schematic diagram shown in FIG. 5.

Within cylindrical housing 11 are circuit boards which contain the electrical components of the cable tester. Upper circuit boards 26 carry the low voltage portions of the circuitry. Mounted on boards 26 are on/off switch 28, transformer 30, relay 32, and capacitors 34 and 36.

Lower circuit board 38 includes the high voltage portions of the circuit. In particular, capacitors 40 and diodes 42 are mounted on circuit board 38. In a preferred embodiment, eight 0.004 microfarad, 4 KV capacitors and thirty-two 1 KV, 1 amp diodes are mounted on lower circuit board 38. Prod 16 and ground terminal 18 are connected to the high voltage circuitry of lower circuit board 38, as is spark gap annunciator 22a.

Figure 5:
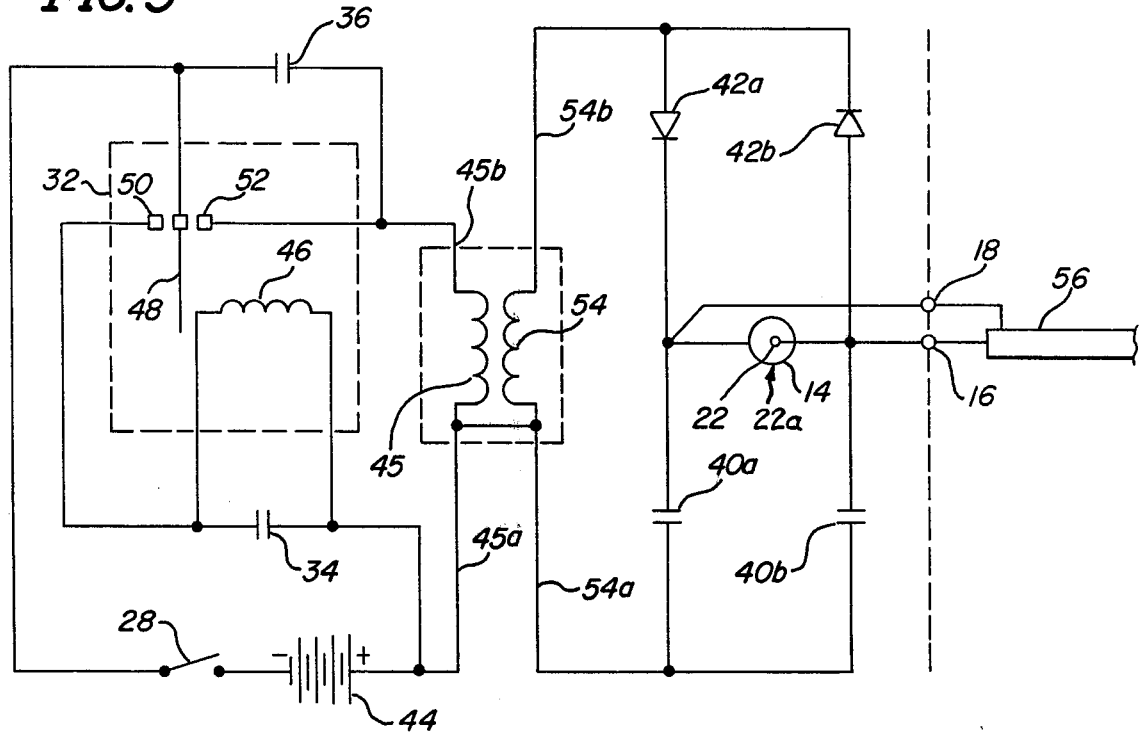
FIG. 5 is an electrical schematic diagram of the cable tester of the present invention.
Figure 2:
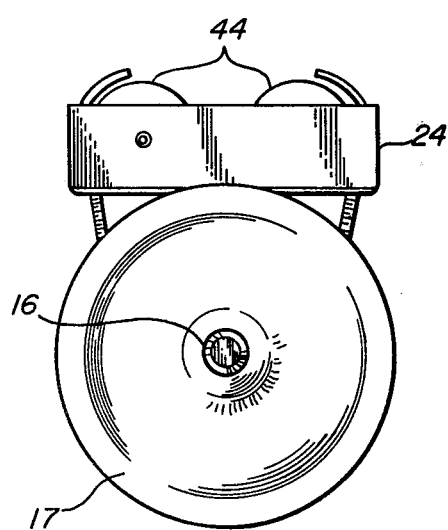
FIG. 2 is a front end view of the cable tester of FIG. 1.
Figure 3:
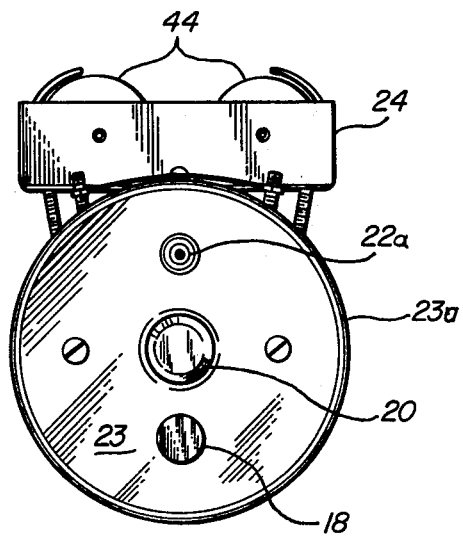
FIG. 3 is a rear end view of the cable tester of FIG. 1.

FIG. 5 shows an electrical schematic diagram of the cable tester of FIGS. 1-4. As shown in FIG. 5, batteries 44, which are located within battery box 24, provide six to twelve volts. Switch 28 has one terminal connected to the negative terminal of batteries 44. The positive terminal of batteries 44 is connected to one terminal 45a of primary winding 45 of transformer 30.

Relay 32 includes a coil 46, a movable blade 48, a normally closed contact 50, and a normally open contact 52. Coil 46 is connected across capacitor 34 which provides the timing. Coil 46 and capacitor 34 have one terminal connected to the positive terminal of batteries 44, while the other terminal of coil 46 and capacitor 34 is connected to normally closed contact 50. Normally open contact 52 is connected to terminal 45b of primary winding 45 of transformer 30.

Switch 28 is connected to movable blade contact 48 of relay 32. Capacitor 36 is connected between movable blade contact 48 and normally open contact 52 and provides the surge to produce the high voltage in secondary winding 54.

The high voltage portion of the circuit includes secondary winding 54, capacitors 40a and 40b, diodes 42a and 42b, spark gap annunciator 22a, prod 16, and ground terminal 18. Diode 42a and capacitor 40a are connected in series between terminals 54b and 54a of secondary winding 54. The anode of diode 42a is connected to terminal 54b, and the cathode is connected to one terminal of capacitor 40a. The other terminal of capacitor 40a is connected to terminal 54a.

Similarly, capacitor 40b and diode 42b are connected between terminal 54a and terminal 54b. Capacitor 40b has one terminal connected to terminal 54a, and its other terminal connected to the anode of diode 42b. The cathode of diode 42b is connected to terminal 54b of secondary winding 54.

Prod 16 is connected to the junction of the anode of diode 42b and one terminal of capacitor 40b. Ground terminal 18 is connected to the junction of capacitor 40a and the cathode of diode 42a. In addition, the spark gap annunciator 22a is connected across the same junction points, and therefore is connected in parallel with prod 16 and ground terminal 18.

In one preferred embodiment of the present invention, spark gap annunicator 22a has a breakdown threshhold in the range of 11 to 15 KV. This is a sufficiently high voltage to test the integrity of the insulation of cable 56 which is under test. As illustrated schematically in FIG. 5, prod 16 is preferably connected to the inner conductor of cable 56, and ground terminal 18 is connected to the outer or ground conductor of cable 56.

In one preferred embodiment of the present invention, multiple capacitors and diodes are used rather than single capacitors and diodes as illustrated in FIG. 5. For example, capacitor 40a is preferably four capacitors connected in series, each of which has a voltage rating of 4 KV and a capacitance of 0.004 microfarads. Capacitor 40b has a similar number of capacitors connected in series. Similarly, diodes 42a and 42b each are formed by sixteen diodes having a 1 KV, 1 amp rating. The use of multiple diodes and capacitors permits a high voltage device which is still portable and relatively light weight.

When switch 28 is closed, batteries 44 charge capacitor 34 through normally closed contact 50 and movable blade 48 thereby providing power to energize relay winding 46. When the magnetic field produced by coil 46 becomes sufficiently strong, it draws blade 48 away from contact 50, and blade 48 closes with contact 52, thereby charging capacitor 36. This in turn causes deenergization of winding 46 and return of blade 48 to normally closed contact 50. In effect, therefore, the low voltage portion of the circuitry is a vibrator circuit which produces an alternating current in primary winding 45. A mechanical relay is preferred to a solid state device because an audible sound indicates to the operator that the charging means is operating.

The voltage induced in primary winding 45 is stepped up in secondary winding 54. Diodes 42a and 42b and capacitors 40a and 40b act as a voltage doubler circuit to produce a high voltage between prod 16 and ground terminal 18. During one half cycle, capacitor 40a is being charged, while during the opposite half of the cycle, capacitor 40b is being charged in an opposite direction. The total voltage between prod 16 and ground terminal 18 is the sum of the voltages across capacitors 40a and 40b.

Since ground terminal 18 is connected to the outside of cable 56, it is maintained at ground potential. As the voltage between prod 16 and ground terminal 18 begins to increase, the voltage across the insulation of cable 56 increases. If cable 56 is not defective, the voltage across prod 16 and ground terminal 18, and therefore the voltage across spark gap annunciator 22a, will rise until the spark gap threshold is reached. At that point, the air between the spark gap electrodes breaks down, producing both a visual and an audible signal.

If, on the other hand, there is a defect or fault in cable 56, the fault will shunt the capacitor voltage being applied between prod 16 and ground terminal 18. The voltage never reaches the spark gap threshold, and no signal is produced. The lack of a signal from spark gap annunciator 22a within a short period after turning on tester 10 indicates a defective cable.

In the circuit shown in FIG. 5, the potential of ground terminal 18 is ground potential, as stated previously. On/off switch 28 therefore, is at a potential half way between ground potential and the potential at prod 16. For that reason, switch handle 20 shown in FIGS. 1-4 should be insulated.

Figure 6:
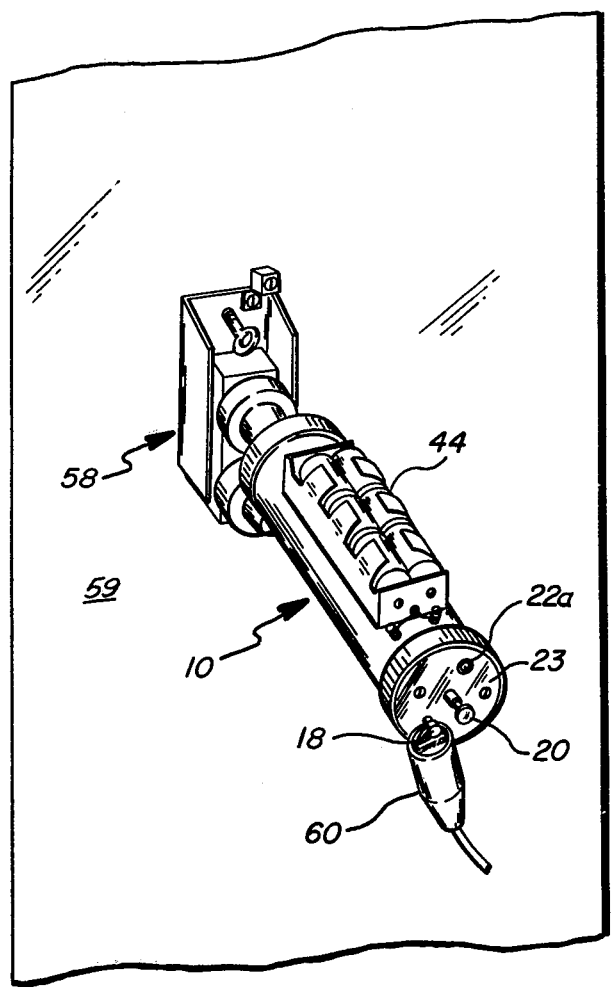
FIG. 6 is a perspective view showing the cable tester of the present invention in use.

FIG. 6 shows the cable tester of the present invention in use testing a cable (not shown). Testing of the cable requires that both ends of the cable be disconnected.

The serviceman disconnects the cable to be tested at the transformer housings at both ends of the cable. A double standoff bushing or insulator 58, such as the 2601873B01 portable feed thru device manufactured by RTE Corporation, is installed in the accessory bracket of transformer housing 59, and the center conductor of the cable is connected to double standoff insulator 58. The serviceman also goes to the next transformer or junction in the power distribution loop, disconnects the cable at that end, and installs it on a standoff insulator or the like to assure that the cable is isolated.

After the cable has been isolated, the cable tester 10 is assembled. In particular, prod 16 is preferably detached from the remainder of tester 10 for easier transportation. The serviceman, therefore, first threads prod 16 into front end 12. He then tests the cable tester itself by turning it on with the push/pull switch handle 20 and watches for sparking across spark gap annunciator 22a. If the tester is operating properly, sparking across the spark gap annunciator 22a should occur, since there is no shunting of the capacitor voltage between prod 16 and ground terminal 18.

The serviceman then further tests cable tester 10 by connecting a jumper wire (not shown) between prod 16 and ground terminal 18. A spark may exit during initial connection of the jumper because the capacitors within cable tester 10 may be holding a charge. Once the tester is turned on with the jumper wire connected, no spark should be seen across spark gap annunciator 22a, since the jumper wire is shunting the capacitor voltage between prod 16 and ground terminal 18.

Cable tester 10 is then connected to the cable to be tested as follows. First, jumper wire 60 is connected between ground terminal 18 of cable tester 10 and the ground wire or sheath of the cable to be tested. Second, prod 16 of tester 10 is inserted into the open side of double standoff bushing 58. Third, cable tester 10 is then turned on by pulling out switch handle 20. If after a few seconds a spark snaps at spark gap annunciator 22a, the cable being tested is good and can be reenergized. If after approximately one-half minute (for a 1,000 foot polyethylene insulated cable, or longer with a longer cable) no spark has occurred, the cable can be considered faulty, and should be held out for further fault finding with more sophisticated equipment. Fourth, cable tester 10 is then removed from the double standoff bushing 58 and the charge is removed by shorting electrodes 16 to 18, if the unit is to be retured to its case for transport.

After the testing of the cable has occurred, it is a good practice to retest cable tester 10 as was done prior to connection of the cable. This verifies that cable tester 10 was operating correctly while testing the cable.

In conclusion, the cable tester of the present invention is a portable, relatively low weight, simple to use, yet accurate device for testing for faults in electrical cables. The preferred embodiment of the present invention uses only one non-rigid connector (the wire used to connect the ground terminal), and therefore the possibility of accidental electric discharge is minimized. Although other equipment has been developed for providing these tests, the equipment has tended to be larger, more difficult to transport, more expensive and more difficult to use.

Although the present invention has been described with reference to preferred embodiments, workers skilled in the art will recognize that changes may be made in form and detail without departing from the spirit and scope of the invention.

What is claimed is:

1. A cable tester for testing an electrical cable having a first conductor, a second conductor, and insulation therebetween forming a cable capacitance, the cable tester comprising:
    a housing;
    a first terminal comprising a rigid elongated electrically conductive male contact prod extending outward from a first end of the housing for insertion in a female type electrically insulating receptacle having an electrical contact therein electrically connected to the first conductor, whereby the first terminal is electrically connected to the first conductor when the male contact prod is inserted in the receptacle and engages the electrical contact therein;
    a second terminal for connection by a non-rigid connector means to the second conductor;
    capacitor means connected between the first and second terminals;
    charging means for charging the capacitor means and thereby simultaneously charging the cable capacitance to establish a DC voltage; and
    annunciator means for providing an indication when the DC voltage attains a threshold value, whereby failure of the DC voltage to attain the threshold value within a time period after connection of the first and second terminals to the first and second conductors is indicative of a fault in the insulation between the first and second conductors.

2. The cable tester of claim 1 wherein the annunciator means comprises a spark gap annunciator which produces a spark when the DC voltage attains the threshold value.

3. The cable tester of claim 2 wherein the spark gap annunciator is connected to the capacitor means.

4. The cable tester of claim 3 wherein the spark gap annunciator also is connected to the first and second terminals.

5. The cable tester of claim 1 wherein the charging means comprises:
    means for providing AC electrical power; and
    rectifying means for providing charging current to the capacitor means.

6. The cable tester of claim 5 wherein the means for providing AC electrical power comprises:
    DC battery means;
    step-up transformer means having a primary connected in circuit with the DC battery means and a secondary connected in circuit with the rectifying means; and
    means connected in circuit with the DC battery means and the primary for periodically interrupting current flow.

7. The cable tester of claim 6 wherein the secondary has a first winding terminal and a second winding terminal, wherein the rectifying means comprises first and second rectifier means connected between the first winding terminal and the first and second terminals, respectively, and wherein the capacitor means comprises first and second capacitor means connected between the second winding terminal and the first and second terminals, respectively.

8. The cable tester of claim 7 and further comprising:
    on/off switch means connected in circuit with the DC battery means.

9. The cable tester of claim 1 wherein the annunciator means comprises a spark gap annunciator mounted at a second end of the housing and connected to the first and second terminals, and wherein the cable tester further includes an electrically insulating transparent cover over at least a portion of the second end of the housing to permit viewing of the spark gap annunciator.

10. A cable tester for testing an electrical cable having a first conductor, a second conductor, and insulation therebetween forming a cable capacitance, the cable tester comprising:
   a housing;
   a first terminal comprising a rigid electrically conductive male contact prod extending outward from a first end of the housing for insertion in a female type electrically insulating receptacle having an electrical contact therein electrically connected to the first conductor, wherein the first terminal is electrically connected to the first conductor when the male contact prod is inserted in the receptacle and engages the electrical contact therein;
   a second terminal for connection by a non-rigid connector means to the second conductor;
   charging means connected to the first and second terminals for charging the cable capacitance to establish a DC voltage between the first and second terminals;
   a spark gap annunciator connected to the first and second terminals for providing a spark when the DC voltage attains a threshold value, whereby failure of the charging means to charge the cable capacitance to a level at which the DC voltage attains the threshold value within a time period after connection of the first and second terminals to the first and second conductors, and thereby the failure of the spark gap annunciator to produce a spark within the time period, is indicative of a fault in the insulation between the first and second conductors.

11. The cable tester of claim 10 and further comprising:
   capacitor means connected between the first and second terminals, and wherein the charging means charges both the capacitor means and the cable capacitance.

12. The cable tester of claim 1 wherein the cable tester further includes an electrically insulating transparent cover over at least a portion of the housing to permit viewing of the spark gap annunciator.

13. The cable tester of claim 10 wherein the second terminal is located at a position remote from the first end of the housing.

14. The cable tester of claim 13 wherein the housing has a second, opposite end, and wherein the spark gap annunciator is mounted at the second end.

15. The cable tester of claim 14 wherein an on/off switch is mounted at the second end.

16. The cable tester of claim 14 wherein the second terminal is mounted at the second end.

17. A cable tester for testing an electrical cable having a first conductor, a second conductor, and insulation therebetween forming a cable capacitance, the cable tester comprising:
   a first terminal for connection to the first conductor;
   a second terminal for connection to the second conductor;
   capacitor means connected between the first and second terminals;
   charging means for charging the capacitor means and thereby simultaneously charging the cable capacitance to establish a DC voltage between the first and second terminals; and
   a spark gap annunciator connected between the first and second terminals for providing a spark when the DC voltage between the first and second terminals attains a threshold value of the spark gap annunciator, the threshold value being a voltage great enough so that if a fault in the insulation is present, it shunts the capacitor means and prevents the DC voltage from attaining the threshold value, whereby the failure of the spark gap annunciator to produce a spark within a time period after connection of the first and second terminals to the first and second conductors is indicative of a fault in the insulation between the first and second conductors.

* * * * *